United States Patent
Prema et al.

(10) Patent No.: US 7,023,216 B2
(45) Date of Patent: Apr. 4, 2006

(54) INDICATOR FOR USE IN VEHICLES HAVING AN ENERGY STORAGE DEVICE

(75) Inventors: Mukunda V. Prema, Canton, MI (US); Ryan A. McGee, Ann Arbor, MI (US); Christopher A. Ochocinski, Canton, MI (US); Stephen J. Hunter, Dearborn, MI (US); J. Anthony Lockwood, Westland, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 93 days.

(21) Appl. No.: 10/605,389

(22) Filed: Sep. 26, 2003

(65) Prior Publication Data

US 2005/0068007 A1 Mar. 31, 2005

(51) Int. Cl.
*G01N 27/416* (2006.01)
(52) U.S. Cl. ........................ 324/435; 324/427
(58) Field of Classification Search ................ 324/435, 324/427
See application file for complete search history.

(56) References Cited

U.S. PATENT DOCUMENTS

| 4,333,149 | A |   | 6/1982 | Taylor et al. |
| 4,595,880 | A | * | 6/1986 | Patil ........................... 324/427 |
| 5,119,011 | A |   | 6/1992 | Lambert |
| 5,578,915 | A |   | 11/1996 | Crouch, Jr. et al. |
| 5,701,068 | A | * | 12/1997 | Baer et al. .................. 320/119 |
| 5,847,566 | A | * | 12/1998 | Marritt et al. .............. 324/427 |
| 6,061,639 | A | * | 5/2000 | Wistrand ..................... 324/427 |
| 6,265,877 | B1 |   | 7/2001 | Kimura et al. |
| 6,480,106 | B1 |   | 11/2002 | Crombez et al. |
| 6,700,213 | B1 | * | 3/2004 | Wakashiro et al. ....... 290/40 C |

* cited by examiner

*Primary Examiner*—Vincent Q. Nguyen
*Assistant Examiner*—Timothy J. Dole
(74) *Attorney, Agent, or Firm*—Brooks Kushman P.C.; David B. Kelley

(57) ABSTRACT

An indicator to indicate an amount of power available from an energy storage device. The indicator normalizes raw power values to values which are understood by the driver. The indicator indicates the normalized values to facilitate making a driving decision.

16 Claims, 4 Drawing Sheets ary power source and a secondary power source. Typically, the primary power source is a fuel cell, an engine, or other energy generating device, and the secondary power source is a battery or other energy storing device.

INDICATOR FOR USE IN VEHICLES HAVING AN ENERGY STORAGE DEVICE

BACKGROUND OF INVENTION

1. Field of the Invention

The present invention relates to an indicator for use in vehicles having an energy storage device. The indicator indicates an amount of power available from the energy storage device.

2. Background Art

A hybrid electric vehicle (HEV) includes at least a primary power source and a secondary power source. Typically, the primary power source is a fuel cell, an engine, or other energy generating device, and the secondary power source is a battery or other energy storing device.

The secondary power source, such as the battery, can be used to provide energy to an electric motor or other electric device for electric assist. The electric assist generally includes providing torque for driving the vehicle. The electric assist torque can supplement torque provided by the primary power source, it can be the sole source of torque, or it can used to engage an electric four-wheel drive system.

The secondary power source stores energy as opposed to generating energy. As such, the amount of energy the secondary power source can provide for generating torque is limited to its stored energy.

It is desirable to indicate to the driver the amount of stored energy available from the secondary power source. As such, there exists a need to indicate an amount of power available from the energy storage device.

SUMMARY OF INVENTION

The present invention addresses the need identified above with an indicator. The indicator indicates an amount of power available from an energy storage device. The indicator normalizes raw energy values to values which are understood by the driver.

One aspect of the present invention relates to an indicator system in a vehicle having an energy storage device that contributes power to an electric assist device. The indicator can be used with any electric assist device in the vehicle that can be used for providing torque.

The system can be used with traction motors in a series hybrid electric vehicle (SHEV), a parallel hybrid electric vehicle (PHEV), and a powersplit hybrid electric vehicle (PSHEV). In addition, the indicator can be used with electric four-wheel drive vehicles where a battery powers an electric motor used to optionally drive normally non-driven wheels of a two-wheel drive vehicle in order to provide electric four-wheel drive.

The system includes a processing source to calculate a normalized amount of power available from the energy storage device. In addition, the system includes an indicator to indicate the normalized amount of power available from the energy storage device so that the driver can view the indicator.

DETAILED DESCRIPTION

Figure 1:
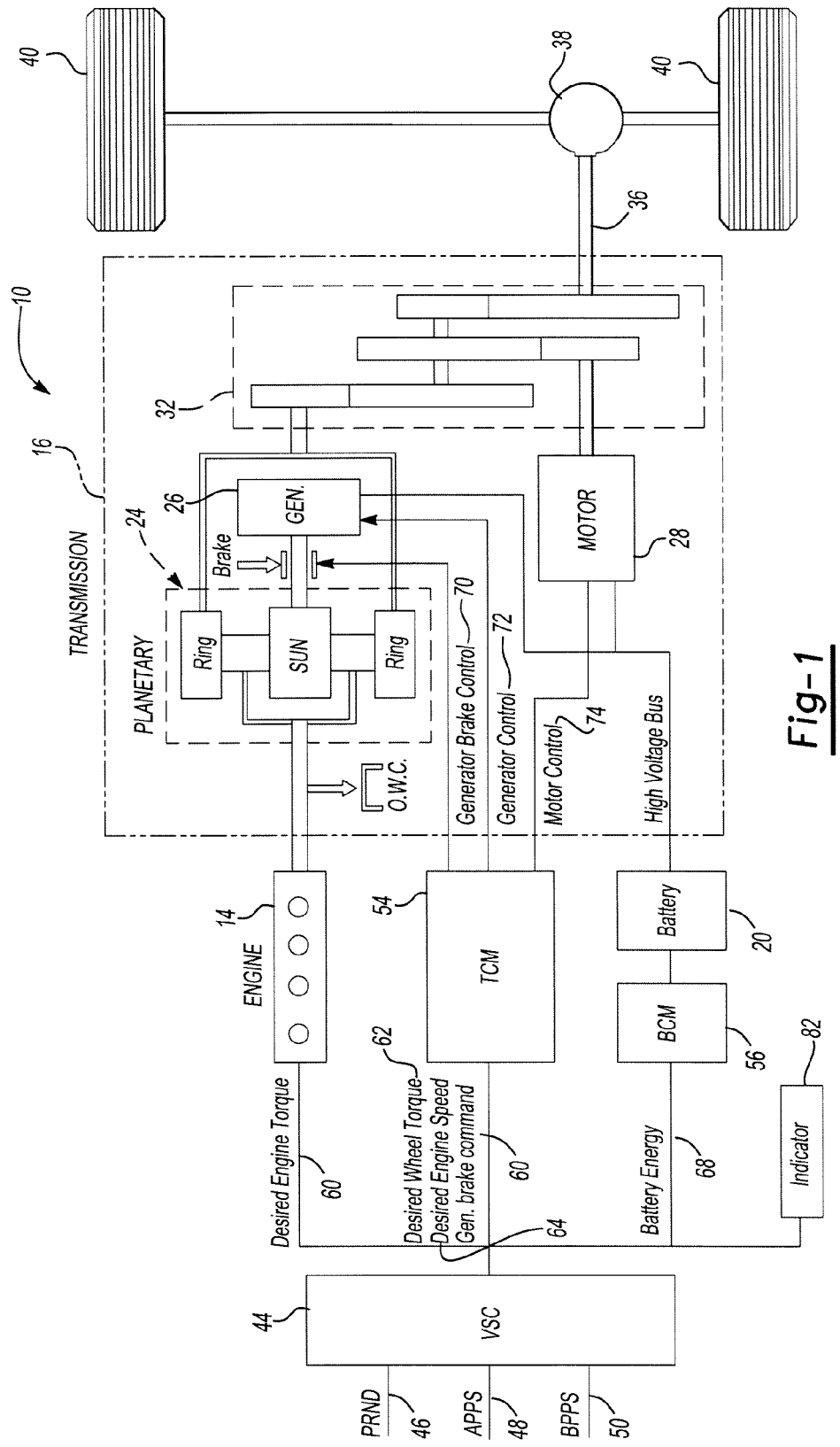
FIG. 1 illustrates an exemplary hybrid electric vehicle system having an indicator in accordance with the present invention.

FIG. 1 illustrates an exemplary hybrid vehicle that is commonly referred to as a powersplit hybrid vehicle (PSHEV) system 10. The system 10 includes an engine 14, a transmission 16, and a battery 20 which operate with a planetary gear set 24, a generator 26, a motor 28, and meshing gears 32 to provide the torque. The torque is received by a torque shaft 36 for transfer to a differential axle 38 mechanism for final delivery to wheels 40.

The present invention can be used with any hybrid system which includes the battery or other energy storage device to provide power to the electric assist device. In particular, the present invention can be used with a series hybrid electric vehicle (SHEV), a parallel hybrid electric vehicle (PHEV), and a powersplit hybrid electric vehicle (PSHEV). In addition, the system can be used with electric four-wheel drive vehicles where a battery powers an electric motor used to optionally drive normally non-driven wheels of a two-wheel drive vehicle in order to provide electric four-wheel drive. In the case of electric four-wheel drive, the electric assist device may not couple to the transmission 18 as shown.

A vehicle system controller 44 (VSC) selects the power and torque delivery mode based on the vehicle operating conditions and a predefined strategy. To this end, the vehicle system controller 44 receives a signal from a transmission range selector 46 (PRND), accelerator pedal position (APP) 48, a brake pedal position sensor 50 (BPPS), and a battery signal 68 indicating battery energy levels.

In response to the received signals, the vehicle system controller 44 generates signals to the engine 14, a transmission control module 54 (TCM), and a battery control module 56 (BCM). Theses signals include a desired engine torque 60, a desired wheel torque 62, a desired engine speed 64, and a generator brake command 66. The modules then provide further signal to control the hybrid vehicle, such as a generator brake control 70, a generator control 72, and a motor control 74.

The use of the battery 20 to provide power to the motor 28 for driving the vehicle is commonly referred to as electric assist. The electric assist can be provide as the sole source or torque or in combination with torque provided by the engine 14.

The system 10 further includes a relative level indicator 82. The level indicator 82 indicates an amount of power available from the battery 20, or other energy storage device that may be used, such as an ultracapacitor, in place of the battery.

Figure 2:
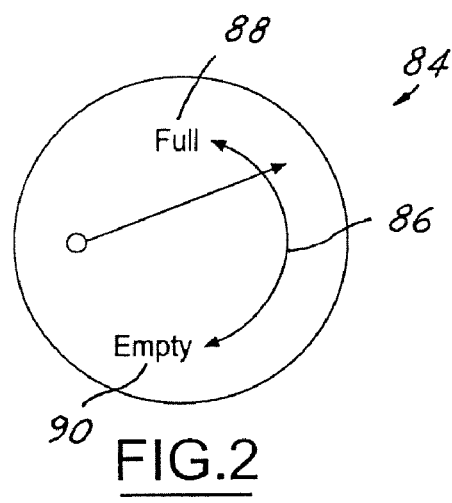
FIG. 2 illustrates one embodiment of the indicator providing a percentage display in accordance with the present invention.

FIG. 2 illustrates a relative percentage indicator 84 in accordance with the present invention. The relative percentage indicator 84 includes a displayed level 86. The driver can view the displayed level 28 to determine whether the battery 20 has sufficient power to conduct a desired driving operation. In this manner, the driver makes a driving decision based on the indicator 84. The displayed level 86 indicates the level relative to a full position 88 and an empty position 90.

The indicator 84 can be located on an instrument panel or in another area viewable by the driver. The driver can view the indicator 84 and may make a driving decision based on the level of indicated power. The displayed level 28 corresponds with a normalized available power value. The normalized available power value is calculated by the vehicle system controller 44 based on one of the number of normalization methods of the present invention.

In general, the displayed level 86 is a normalized value of the available battery power, typically a percentage. The percentage is normalized because the actual or raw amount of power from the battery 20 is not easily understood by the driver. In other words, the driver cannot easily understand how the battery's state of charge or discharge limit affects the amount of power available from the battery. To address this problem, the present invention normalizes the amount of power available from the battery according to one of the normalization methods disclosed below.

Figure 3:
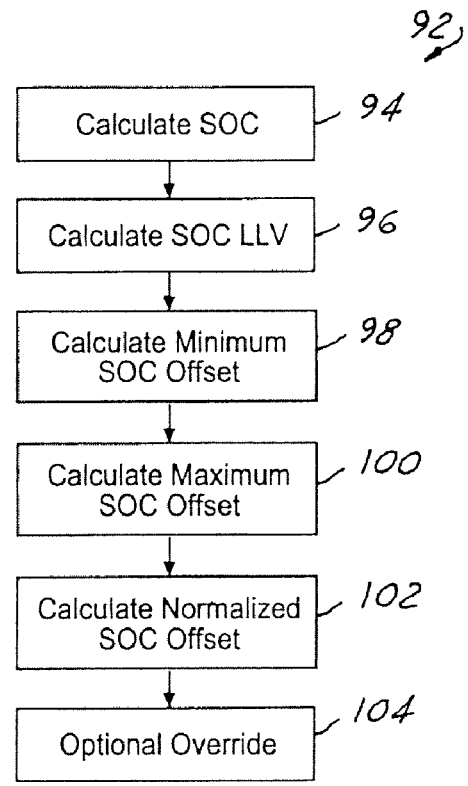
FIG. 3 illustrates a first flow chart for a first normalization method which normalizes a battery state of charge in accordance with the present invention.

FIG. 3 is a flow chart that illustrates a first normalization method, which is referred to with reference numeral 92. The first normalization method includes a step 94 to calculate a battery state of charge (SOC). The SOC is a raw percentage value that indicates how much power the battery has stored relative to its fully charged state. The SOC is a dynamic value derived from operating parameters, such as current, voltage, and temperature of the battery and changes relating to vehicle operation. Accordingly, it is a raw value derived directly from the battery prior to any normalization. The SOC decreases when the battery is discharging, and the SOC increases when the battery is charging.

Step 96 calculates an SOC low limit value (SOC LLV) for the battery. The SOC LLV corresponds with a minimum SOC the battery should maintain at all times to insure full discharge capability. The SOC LLV is selected according to the type of battery and other factors, such as battery temperature and battery age, or it can be calculated by the vehicle system controller 44.

Step 98 calculates a SOC minimum offset to the SOC LLV. The minimum offset includes adding an SOC low offset limit (SOC LOL) to the SOC LLV. Addition of the SOC LOL to the SOC LLV increases the reserve amount of stored power. The reserve amount of power is still available if needed, but it is not indicated to the driver. Preferably, the driver makes a driving decision without reliance on the reserve amount. The SOC LOL provides additional protection to prevent over discharging of the battery. The vehicle system controller 44 selects or calculates the SOC LOL.

Step 100 calculates a SOC maximum offset to the SOC LLV. The maximum offset includes adding an SOC high offset limit (SOC HOL) to the SOC LLV. Much like the minimum offset, the maximum offset indicates a maximum useable amount of SOC. The maximum useable amount of SOC is typically less than the maximum capability of the battery. The SOC HOL is typically a numeric SOC value that corresponds with an idealized high limit on SOC to prevent over charging. The maximum SOC offset is typically less than the battery's rated maximum SOC. The vehicle system controller 44 can select or calculate the SOC HOL.

Step 100 normalizes the SOC calculated in step 40 for display to the driver. The normalization includes adjusting the calculated SOC based on the SOC LLV, SOC LOL, and SOC HOL. The normalized SOC becomes the displayed percentage. Equation (1) illustrates a formula for calculating the normalized SOC in accordance with the first normalization method.

$$\text{Displayed percentage} = \frac{(\text{Calculated } SOC - \text{Minimum Offset})}{(\text{Maximum Offset} - \text{Minimum Offset})} \quad (1)$$

Figure 4:
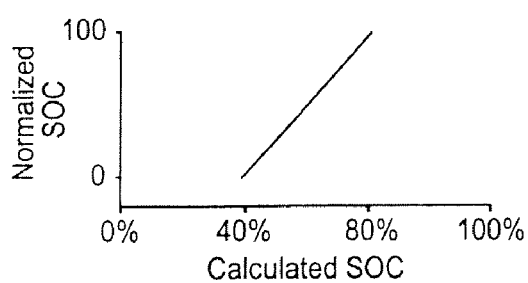
FIG. 4 graphically represents the first normalization method show in FIG. 3.

FIG. 4 is a graphical representation of the first normalization method. The graph of FIG. 4 shows that the SOC LLV is 40%, the SOC LOL is 0%, and the SOC HOL is 40%. A calculated SOC of 40% is displayed as a normalized SOC percentage of 0%. A calculated SOC of 80% is displayed as a normalized SOC percentage of 100%. A calculated SOC in the range of 40% to 80% is linearized and is displayed as a normalized SOC percentage in the range of 0% to 100%.

Returning to FIG. 3, an optional override step 104 permits overriding the displayed percentage. The override forces the displayed percentage to 0% regardless of the normalized SOC. The override is triggered by the battery's discharge limit (DCL). The DCL is a numerical parameter that indicates how rapidly the battery can instantaneously discharge its stored power. Like SOC, DCL is a dynamic value that changes as a result of driving conditions or other vehicle conditions, such as battery temperature.

The override includes monitoring whether DCL is lower than a predefined DCL threshold. The DCL threshold corresponds with the inability of the battery to instantaneously discharge sufficient power. The sufficient power is a design parameter of the battery, but it generally corresponds to the point at which the decision to be made by the driver becomes more affected by the low DCL than the normalized SOC. The override is advantageous because the SOC may be sufficient for conducting the desired driving operation, but the DCL is so low that the battery cannot discharge the desired power regardless of the SOC.

Figure 5:
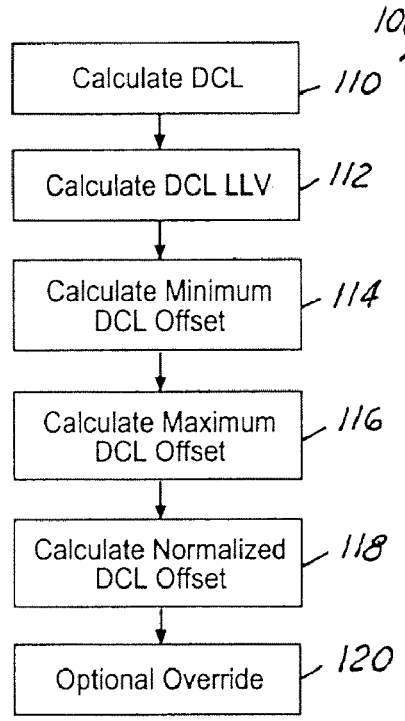
FIG. 5 illustrates a second flow chart for a second normalization method which normalizes a battery discharge limit in accordance with the present invention.

FIG. 5 is a flow chart that illustrates a second normalization method that is referred to with reference numeral 108. This normalization method differs from normalization method illustrated by FIG. 3 in that the displayed percentage is a normalized DCL and the override is triggered by the calculated SOC.

Normalization method 108 includes a step 110 for calculating the DCL of the battery. The DCL is a percentage determined by the vehicle system controller 44. The vehicle system controller calculates a DCL value based on operating parameters of the battery, such as current voltage and temperature, and divides the DCL value by a maximum, or rated, DCL value to determine the percentage value for the DCL.

Step 112 calculates a DCL low limit value (DCL LLV) for the battery. The DCL LLV corresponds with a minimum DCL the battery should maintain to insure minimum vehicle performance. The DCL LLV is selected according to the type of battery and other factors, such as battery temperature, battery age, and battery SOC, or it can be calculated by the vehicle system controller 44.

Step 114 calculates a minimum offset to the DCL LLV. The minimum DCL offset includes adding a DCL low offset limit (DCL LOL) to the DCL LLV. Addition of the DCL LOL to the DCL LLV additionally increases the reserve amount of power the battery should maintain. The reserve amount of power is still available if needed, but it is not indicated to the driver. Preferably, the driver makes a driving decision without reliance on the reserve amount. The vehicle system controller selects or calculates the DCL LOL.

Step 116 calculates a maximum DCL offset to the DCL LLV. The maximum offset includes adding a DCL high offset limit (DCL HOL) to the DCL LLV. Much like the minimum offset, the maximum offset indicates a maximum useable amount of DCL. The maximum useable amount of DCL is typically less than the maximum capability of the battery. The maximum DCL LLV is typically less than the rated maximum DCL. The vehicle system controller can select or calculate the DCL HOL.

Step 118 normalizes the DCL calculated in step 62 for display to the driver. The normalization includes adjusting the calculated DCL based on the DCL LLV, DCL LOL, and DCL HOL. The normalized DCL becomes the displayed percentage. Equation (2) illustrates a formula to calculate the normalized DCL in accordance with the second normalization method.

$$\text{Displayed percentage} = \frac{(\text{Calculated } DCL - \text{Minimum } DCL \text{ Offset})}{(\text{Maximum } DCL \text{ Offset} - \text{Minimum } DCL \text{ Offset})} \qquad (2)$$

Figure 6:
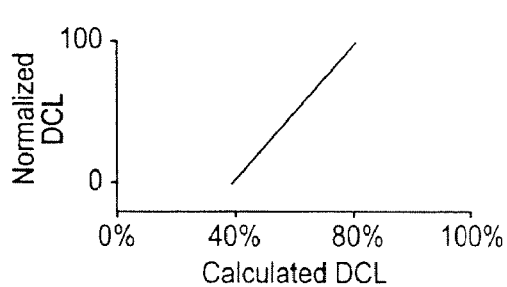
FIG. 6 graphically represents the second normalization method show in FIG. 5.

FIG. 6 is a graphical representation of the second normalization method. The graph of FIG. 6 shows that when the DCL LLV is 40%, the DCL LOL is 0%, and the DCL HOL is 40%. As such, a calculated DCL of 40% is displayed as a normalized DCL percentage of 0%. A calculated DCL of 80% is displayed as a normalized DCL percentage of 100%. A calculated DCL in the range of 0% to 40% is linearized and is displayed as a normalized DCL percentage in the range of 0% to 100%.

Returning to FIG. 5, an optional override step 120 permits overriding the displayed percentage. The override forces the displayed percentage to 0% regardless of the normalized DCL. The override is triggered by the SOC of the battery. The override includes monitoring whether SOC is lower than a predefined SOC threshold. The predefined SOC threshold corresponds with the inability of the battery to provide sufficient power to operate the vehicle. The low SOC threshold is a design parameter of the battery, but it generally corresponds to the point at which the decision to be made by the driver becomes more effected by the low SOC than the normalized DCL. The override is advantageous because the DCL may be sufficient for conducting the desired driving operation, but the SOC may be so low that the battery cannot provide enough power to achieve sustained vehicle performance regardless of the DCL.

Figure 7:
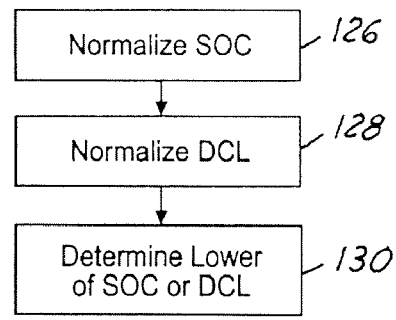
FIG. 7 illustrates a third flow chart for a third normalization method which normalizes a battery state of charge and a battery discharge limit in accordance with the present invention.

FIG. 7 is a flow chart that illustrates a third normalization method, referred to with reference numeral 124. The third normalization method includes a step 126 to normalize SOC based on the normalization of SOC disclosed in the normalization method described with reference to FIG. 3 and equation (1). Step 128 corresponds with normalizing DCL based on the normalization of DCL disclosed in the normalization method described with reference to FIG. 5 and equation (2). Step 130 determines a lowest normalized percentage out of the normalized SOC and the normalized DCL. The displayed percentage becomes the lowest of the normalized SOC and DCL percentages.

Figure 8:
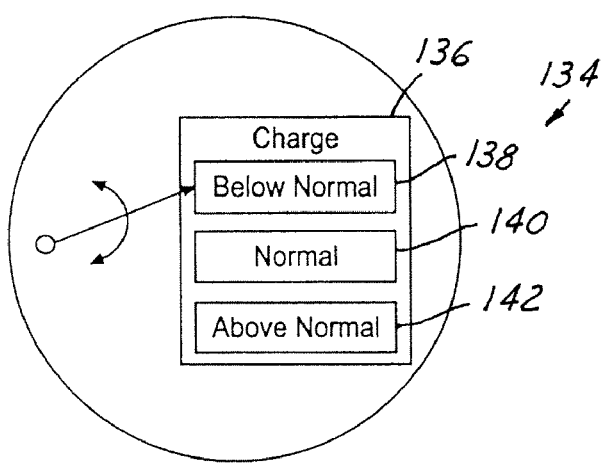
FIG. 8 illustrates one embodiment of the indicator providing a range display in accordance with the present invention.

FIG. 8 illustrates a range indicator 134 in accordance with one aspect of the present invention. The range indicator displays charge ranges 136 of available battery power, such as a below-normal battery charge 138, a normal battery charge 140, and an above-normal battery charge 142. The range indicated is selected according to percentage ranges assigned to each range. The displayed percentage from the first normalization method, the second normalization method, or the third normalization method can be matched to one of the ranges.

For the first normalization method, the below-normal battery charge 138 can correspond with a normalized SOC in the range of 0–25%, the normal battery charge 140 can correspond with a normalized SOC in the range of 25%–75%, and the above-normal battery charge 142 can correspond with a normalized SOC in the range of 75%–100%. In addition, hysteresis logic or an offset threshold can be included to prevent oscillations between the different ranges. More or less ranges can be included, for example, rather than three ranges, indicators for low charge and normal charge can be used.

Figure 9:
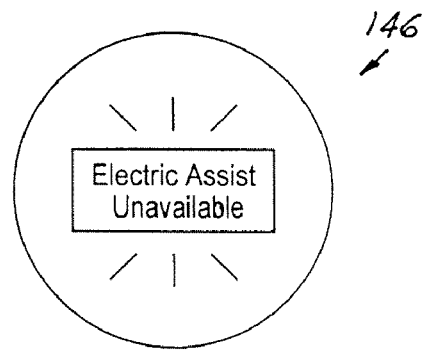
FIG. 9 illustrates one embodiment of the indicator providing an electric assist available display in accordance with the present invention.

FIG. 9 illustrates an electric assist unavailable indicator 146. The electric assist unavailable indicator 146 is a light that illuminates based on a normalized amount of power available from the battery. If the light is illuminated, then electric assist is limited, and if the light is unilluminated, then electric assist is available.

The indicator 146 can be particularly adapted to indicating the availability of electric four-wheel drive assist in a vehicle having non-driven wheels which are driven by an electric motor to provide electric four-wheel drive. In this case, a limit value would be set for indicating whether electric four-wheel drive is available. Preferably, the limit would be based on a normalized amount of available battery power as described above.

Figure 10:
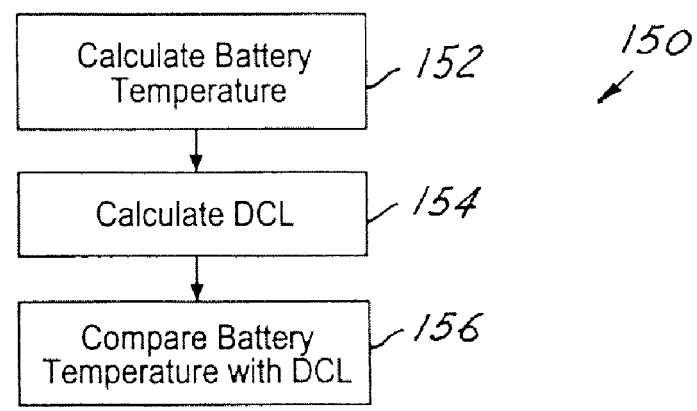
FIG. 10 illustrates a fourth flow chart for a fourth normalization method which normalizes a battery discharge limit based on a battery temperature threshold in accordance with the present invention.

The normalized amount of available power from the battery can be determined from one of the above-described normalization methods, or according to a fourth normalization method. The fourth normalization method is graphically shown in FIG. 10.

Figure 11:
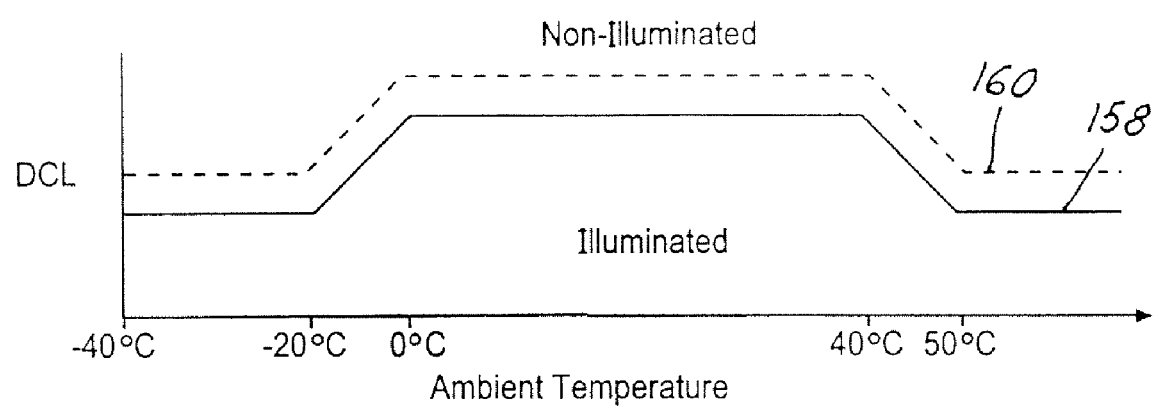
FIG. 11 graphically represents the fourth normalization method show in FIG. 10.

The fourth normalization method 150 includes a step 152 for calculating the battery temperature of the vehicle. Step 154 calculates DCL as described above. Step 156 compares DCL against the battery temperature DCL threshold. The comparison step 156 is based on a graphical DCL temperature threshold, as shown in FIG. 11.

If the DCL is greater than a DCL battery temperature threshold 158, then electric assist is available and the indicator 146 is non-illuminated, and if the DCL is less than the DCL ambient temperature threshold 158, then electric assist is unavailable and the indicator 146 is illuminated. In addition, hysteresis and offset logic 160 can optionally be included to prevent oscillations. The hysteresis 160 operates to increase a percentage of the DCL must exceed each time the calculated DCL drops below the DCL ambient temperature threshold 112.

While the embodiment described above relates to an HEV, the present invention is not so limited. In contrast, the present invention operates with any type of vehicle that relies on an energy storage device, whether the energy storage device is a battery, an ultra capacitor or other device, for at least a portion of the power used to drive the vehicle. In addition, the present invention is not limited to automotive vehicles. Rather, the present invention can operate with any type of vehicle or vessel, such as boats and airplanes.

While the best mode for carrying out the invention has been described in detail, those familiar with the art to which this invention relates will recognize various alternative designs and embodiments for practicing the invention as defined by the following claims.

The invention claimed is:

1. In an electric vehicle having an energy storage device, an indicator system comprising:
   a processing source to calculate a normalized amount of power available from the energy storage device, the normalized amount being calculated as a function of desired limits on operator use of power actually available from the energy source;
   an indicator to indicate the normalized amount of power available from the energy storage device;
   wherein the energy source is a battery which provides power for use in providing electric assist and the processing source calculates the normalized amount of power available from the battery as a normalized battery state of charge (SOC) such that the indicator indicates the normalized SOC; and
   wherein the normalized battery SOC is calculated based in part on a calculated battery SOC, a minimum battery SOC offset, and a maximum SOC offset.

2. The system of claim 1 wherein the processing source further comprises a battery discharge limit (DCL) override, wherein the override forces the normalized battery SOC to zero in response to the DCL being less than a predefined threshold.

3. The system of claim 1 wherein the normalized amount of power available from the energy storage device is a range selected from the group comprising below-normal battery charge, normal battery charge, and above-normal battery charge.

4. The system of claim 3 wherein the range is based on the normalized battery state of charge (SOC).

5. The system of claim 3 wherein the range is based on a normalized percentage discharge limit (DCL).

6. The system of claim 3 wherein the indicator includes a percentage display for indicating the normalized amount of power available from the energy storage device.

7. The system of claim 1 wherein the indicator includes an illuminable light that is illuminated based on the normalized amount of power available from the battery, wherein electric assist is unavailable if the light is illuminated and electric assist is available if the light is unilluminated; and
   wherein the normalized amount of power available from the energy storage device is a raw discharge limit (DCL) temperature based threshold, wherein the light is unilluminated when the raw DCL is greater than the threshold and the light is illuminated when the raw DCL is less than the threshold.

8. The system of claim 7 wherein the raw DCL temperature based threshold includes a hysteresis offset threshold such that the raw DCL must surpass the hysteresis offset threshold when the light is illuminated in order to unilluminate the light, wherein the hysteresis offset threshold is greater than the raw DCL temperature based threshold.

9. The system of claim 7 wherein the raw DCL temperature based threshold varies according to a battery temperature.

10. In an electric vehicle having an energy storage device, an indicator system comprising:
    a processing source to calculate a normalized amount of power available from the energy storage device, the normalized amount being calculated as a function of desired limits on operator use of power actually available from the energy source;
    an indicator to indicate the normalized amount of power available from the energy storage device; and
    wherein the energy source is a battery which provides power for use in providing electric assist and the processing source calculates the normalized amount of power available from the battery as a normalized battery discharge limit (DCL) such that the indicator indicates the normalized DCL.

11. The system of claim 10 wherein the normalized battery DCL is calculated based in part on a calculated battery DCL, a minimum battery DCL offset, and a maximum DCL offset.

12. The system of claim 11 wherein the processing source further comprises a battery state of charge (SOC) override, wherein the override forces the normalized battery DCL to zero in response to the DCL being less than a predefined threshold.

13. In an electric vehicle having an energy storage device, an indicator system comprising:
    a processing source to calculate a normalized amount of power available from the energy storage device, the normalized amount being calculated as a function of desired limits on operator use of power actually available from the energy source;
    an indicator to indicate the normalized amount of power available from the energy storage device; and
    wherein the energy source is a battery which provides power for use in providing electric assist and the processing source calculates the normalized amount of power available from the battery as a minimum percentage selected from the group comprising a normalized battery of state of charge (SOC) and a battery percentage discharge limit (DCL).

14. The system of claim 13 wherein the normalized battery SOC is calculated based in part on a calculated battery SOC, a minimum battery SOC offset, and a maximum SOC offset, and wherein the normalized battery DCL is calculated based in part on a calculated battery DCL, a minimum battery DCL offset, and a maximum DCL offset.

15. A method to communicate an amount of available battery power to a driver of a vehicle having electric assist, wherein the amount of available battery power is used by the driver to make a driving decisions with respect to electric assist, the method comprising:
    calculating a raw power value for the battery based on operating parameters of the battery;
    normalizing the raw power value to produce a displayable power value, the normalized power value being determined as a function of desired limits on operator use of the raw power actually available from the battery;
    displaying the power value in a position viewable by the driver; and
    wherein the displayable power value is a normalized battery state of charge (SOC) such that the indicator indicates the normalized SOC, wherein the normalized battery SOC is calculated based in part on a calculated battery SOC, a minimum battery SOC offset, and a maximum SOC offset.

16. A method to communicate an amount of available battery power to a driver of a vehicle having electric assist, wherein the amount of available battery power is used by the driver to make a driving decisions with respect to electric assist, the method comprising:

calculating a raw power value for the battery based on operating parameters of the battery;

normalizing the raw power value to produce a displayable power value, the normalized power value being determined as a function of desired limits on operator use of the raw power actually available from the battery;

displaying the power value in a position viewable by the driver; and wherein the displayable power value is a normalized battery calculating discharge limit (DCL) such that the indicator indicates the normalized DCL, wherein the normalized battery DCL is calculated based in part on a calculated battery DCL, a minimum battery DCL offset, and a maximum DCL offset.

* * * * *